United States Patent [19]

Abe

[11] Patent Number: 5,531,608
[45] Date of Patent: Jul. 2, 1996

[54] IC RETAINER IN IC SOCKET

[75] Inventor: Shunji Abe, Yokohama, Japan

[73] Assignee: Yamaichi Electronics Co., Ltd., Tokyo, Japan

[21] Appl. No.: 390,486

[22] Filed: Feb. 17, 1995

[30] Foreign Application Priority Data

Feb. 24, 1994 [JP] Japan ................................ 6-05292

[51] Int. Cl.⁶ .................................................. H01R 13/62
[52] U.S. Cl. ............................................ 439/330; 439/159
[58] Field of Search ............................ 439/330, 70, 71, 439/72, 73, 152

[56] References Cited

U.S. PATENT DOCUMENTS

| | | | |
|---|---|---|---|
| 4,786,256 | 11/1988 | Angeleri et al. | 439/330 |
| 4,846,703 | 7/1989 | Matsuoka et al. | 439/330 |
| 5,320,550 | 6/1994 | Uratsuji et al. | 439/330 |

FOREIGN PATENT DOCUMENTS 3-289077   12/1991   Japan .

*Primary Examiner*—David L. Pirlot
*Assistant Examiner*—Yong Kim
*Attorney, Agent, or Firm*—Wenderoth, Lind & Ponack

[57] ABSTRACT

An IC retainer in an IC socket comprise a lock lever for engaging and disengaging from an IC or an IC carrier in accordance with upward and downward motion of a cover, a turnable lever for transforming the upward and downward motion of the cover to upward and downward motion of the lock lever, a mechanism for shifting the lock lever to a backward disengaging position when the lock lever is moved upwardly and to a forward engaging position when the lock lever is lowered, and a spring arrangement for applying a downward turning force to an external end portion of the turnable lever while applying a lowering force to that side of the lock lever on which the external end portion of the turnable lever acts. An internal end portion of the turnable lever opposite to that end portion on which the spring arrangement acts is turned upwardly by the downward turning force applied to the external end portion of the turnable lever, so that an upwardly directed force is applied to the cover.

3 Claims, 6 Drawing Sheets

IC RETAINER IN IC SOCKET

BACKGROUND OF THE INVENTION

1. Field of the Invention

This invention relates to an IC retainer in an IC socket, in which an IC or an IC carrier is retained in the IC socket for maintaining a reliable electric connection.

2. Brief Description of the Prior Art

Japanese Laid-Open Patent Application No. Hei 3-289077 teaches an IC retainer comprising a lock lever which is locked to and unlocked from an IC carrier in accordance with upward and downward motion of a cover, a turnable lever for transforming the upward and downward motion of the cover to upward and downward motion of the lock lever, and a groove cam means for shifting the lock lever to a backward unlocking position when the lock lever is moved upwardly and to a forward locking position when the lock lever is moved downwardly.

In order appropriately unlock the lock lever from the IC carrier, it is necessary for the operator to turn the lock lever to the backward unlocking position slightly above the engaging (or locking) surface. Also, in order to apply a depression force (to obtain a contacting pressure) to the IC carrier by bringing the lock lever into appropriate engagement with an edge portion of the IC carrier, it is necessary for the operator to lower the lever after the IC carrier is turned to a higher forward position.

According to the teaching of the prior art, as a means for moving the lock lever upwardly and downwardly, one end portion of the turnable lever and the cover is linked by means of a shaft and an elongate slot, the linking portion is raised under the effect of a spring biasing the cover upwardly, so that one end of the turnable lever will be raised, and the linking portion is depressed by depressing the cover against the biasing force of the spring, so that one end of the turnable lever will be lowered, thereby transforming the upward and downward motion of the cover to the upward and downward motion of the lock lever which is turnably axially supported by the other end of the turnable lever.

According to the teaching of this prior art, the resilient force of the spring acting to push up the cover is transmitted to the lock lever via the linking portion and the turnable lever, so that an upward and downward motion, against the effect of the spring, of the lock lever as well as a downward motion, following the effect of the spring, of the lock lever can be obtained.

However, in the above prior art, since the cover is pushed up under the effect of the spring to resiliently connect the cover and the turnable lever to each other, it is necessary to link one end of the turnable lever to the cover by means of the shaft and the elongate slot in order to have the turnable lever appropriately follow the upward and downward motion of the cover.

That is to say, if the turnable lever and the cover are not linked together, it becomes impossible to raise one end of the turnable lever when the cover is moved upwardly, with the result that a required action of the lock lever can not be obtained.

Further, since the spring force urging the cover upwardly acts on the lock lever via the linking portion and the turnable lever so that the lock lever is lowered, the turning motion of the turnable lever is not smoothly transformed to the vertical downward motion of the lock lever. As a result, the depression force applied to the IC carrier by the lock lever is not sufficient. Consequently, it gives rise to the problems that reliability of contact is lowered and poor electrical connection occurs.

Furthermore, in the prior art, since it is absolutely necessary to link the cover and the turnable lever to each other, manufacturing and assembling are difficult, and play is liable to occur between the shaft and the elongate slot.

The present invention has been accomplished in view of the above-mentioned problems inherent in the prior art.

SUMMARY OF THE INVENTION

It is, therefore, an object of the present invention to provide an IC retainer in an IC socket which is simple in structure and with which a reliable contact pressure can be obtained.

In order to achieve the above object, there is essentially provided an IC retainer in an IC socket, comprising a lock lever for engaging and disengaging from an IC or an IC carrier in accordance with upward and downward motion of a cover, a turnable lever for transforming the upward and downward motion of the cover to upward and downward motion of the lock lever, means for shifting the lock lever to a backward disengaging position when the lock lever is moved upwardly and to a forward engaging position when the lock lever is lowered, and spring means for applying a downward turning force to an external end portion of the turnable lever while applying a lowering force to a side of the lock lever on which the external end portion of the turnable lever acts, an internal end portion of the turnable lever opposite to that end portion on which the spring means acts being turned upwardly by the downward turning force applied to the external end portion of the turnable lever, so that an upwardly directing force is applied to the cover.

The IC retainer may further comprise a pusher mounted on the cover and adapted to push the back of the lock lever forwardly when the lock lever is lowered.

The IC retainer may further comprise a front abutment member for restricting the front of the lock lever.

When the internal end of the turnable lever is pushed down by depressing the cover which is pushed up by the turnable lever by means of a robot or manual operation, the external end of the turnable lever is turned upwardly against the biasing force of the spring and as a result, the lock lever is moved upwardly away from the upper edge of the IC or IC carrier. When the lock lever is moved upwardly, it is shifted backwardly to a disengaging position, so that the IC or IC carrier can be removed smoothly.

In contrast, when the depression force applied to the cover is removed, the spring causes the external end portion on that side of the turnable lever acting on the lock lever to turn downwardly. At the same time, the spring lowers the lock lever. During this downward motion, the lock lever is shifted forwardly to come into engagement with the upper edge of the IC or IC carrier and push down the IC or IC carrier to obtain a sufficient contact pressure.

As a reaction of the downward movement of the external end on that side of the turnable lever acting on the lock lever, the internal end portion of the turnable lever is turned upwardly. This upward turning force pushes up the cover to hold it in a standby position.

According to the present invention, since the spring applies a downward force to the external end portion on that side of the lock lever on which the turnable lever acts, an appropriate upward and downward motion can be obtained by properly applying the spring force to the lock lever. Therefore, the lock lever can be positively engaged with an edge portion of the IC or IC carrier, so that an appropriate contacting pressure can be obtained.

Since the internal end portion of the turnable lever opposite to that side thereof on which the spring acts is merely resiliently contacted with the cover instead of being linked to the cover, the lever can make an appropriate motion following the downward and upward motion of the cover simply by being resiliently contacted with the cover. Therefore, it is no longer necessary, unlike the prior art, to link the turnable lever and the cover by means of a shaft and an elongate slot and therefore, the problem associated with the linkage can be totally obviated.

The novel features which are considered characteristic of this invention are set out in the appended claims. The invention itself, however, together with additional objects and advantages thereof will be best understood from the following detailed description taken in conjunction with the accompanying drawings which illustrate, by way of example only, a preferred embodiment of this invention.

DETAILED DESCRIPTION OF THE EMBODIMENT

Figure 1:
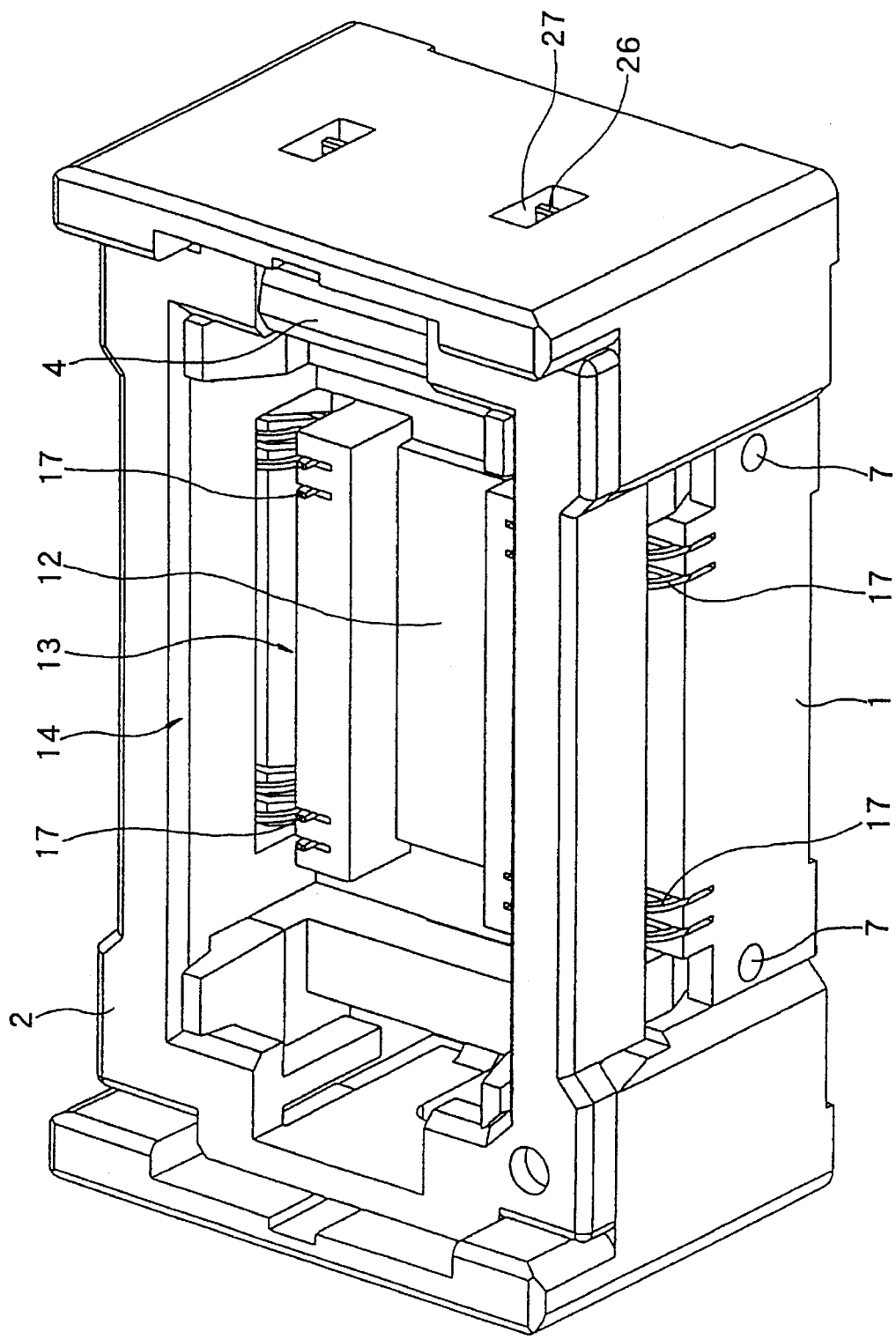
FIG. 1 is a perspective view showing an overall IC socket according to one embodiment of the present invention, in which one of a pair of lock levers is omitted.
Figure 2:
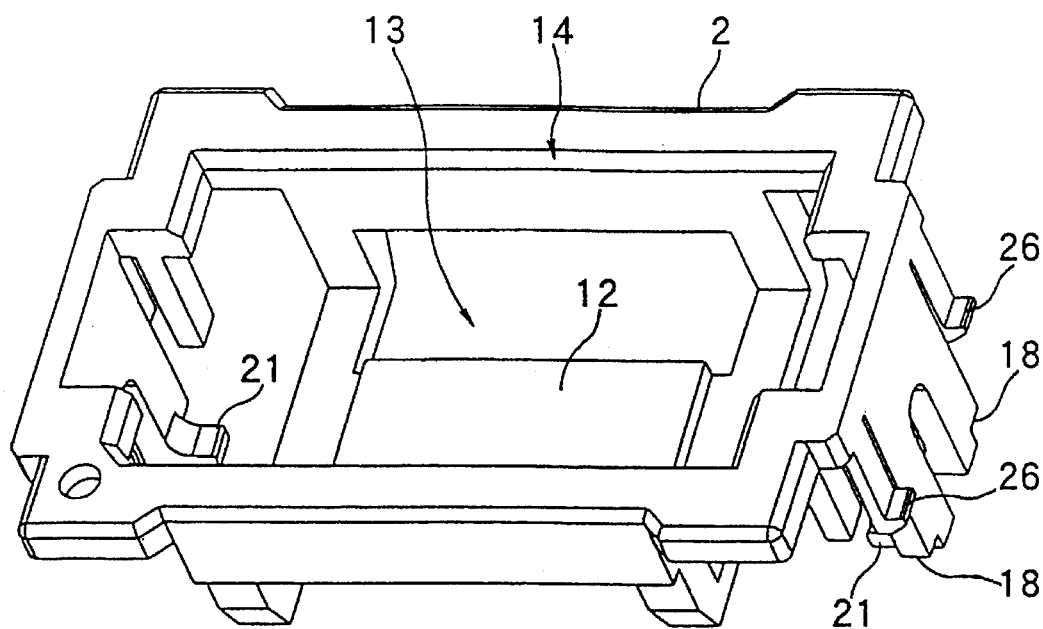
FIG. 2 is a perspective view of a cover.

One embodiment of the present invention will now be described in great detail with reference to FIGS. 1 to 11 inclusive of the accompanying drawings.

The present invention relates to an IC retainer in an IC socket comprising a lock lever 4 which is engaged with and disengaged from an IC carrier 3 retaining therein an IC or IC carrier, by means of upward and downward motion of a rectangular frame-like cover 2 covering an upper portion of a socket base 1, a turnable lever 5 for transforming the upward and downward motion of the cover 2 to upward and downward motion of the lock lever 4, and means for shifting the lock lever 4 to a backward disengaging position when the lock lever 4 is moved upwardly and to a forward engaging position when the lock lever 4 is moved downwardly. It further comprises a spring 6 for applying a downward turning force to an outer end portion of the turnable lever 5 while applying a downward force to that side of the lock lever 4 on which the turnable lever 5 acts. An internal end portion of the turnable lever 5 opposite to that end portion thereof on which the spring 6 acts is turned upwardly by the downward turning force applied to the external end portion of the turnable lever 5, so that the turnable lever 5 is resiliently contacted with the cover 2 and an upwardly directing force is applied to the cover 2. An IC 15 is retained, by a latch 23, within a receiving section which is exposed outside through the upper and lower sides of the carrier 3.

FIGS. 1 to 5 inclusive show one embodiment of the present invention, and FIGS. 6 to 9 inclusive show the outline thereof and the principles of operation thereof.

As illustrated, the turnable lever 5 is disposed under the IC receiving section 13 of the IC or IC carrier 3 and turnably supported on the socket base 1 through a shaft 7. The lock lever 4 is turnably supported by an external end 10 of the turnable lever 5 through a shaft 8. The lock lever 4 is allowed to extend upwardly from the pivotal portion. The lock lever 4 has a locking claw 9 engageable with an edge of an upper surface of the IC or IC carrier 3 and defined on an upper end of the lock lever 4.

Figure 3:
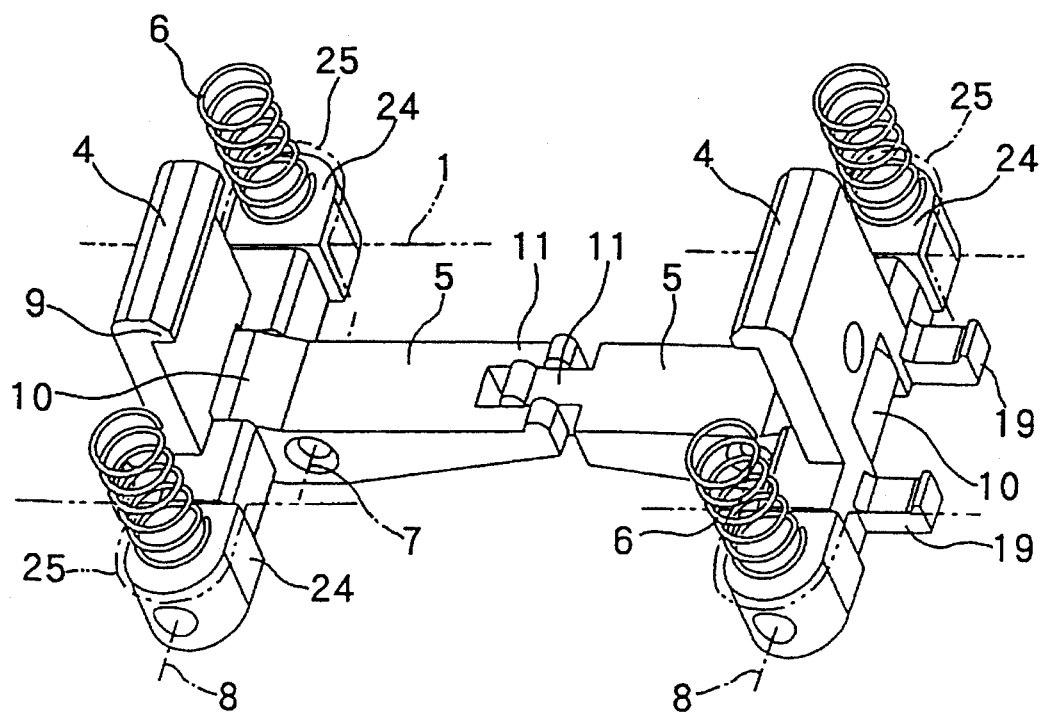
FIG. 3 is a perspective view of an IC retainer which comprises a pair of lock levers and a turnable lever unit.
Figure 5:
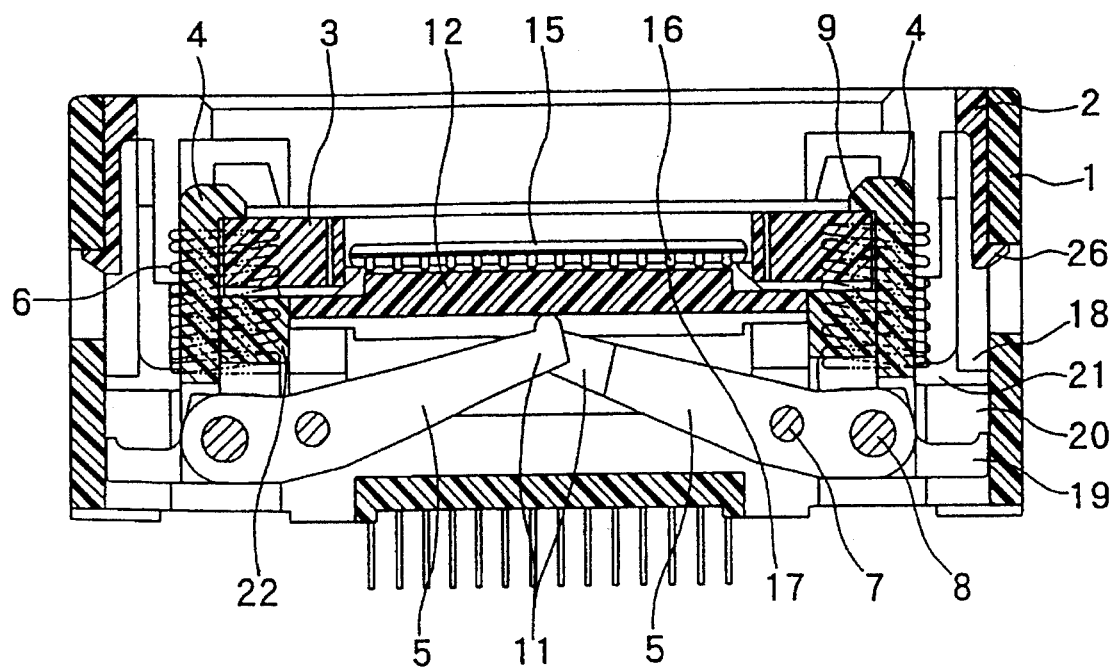
FIG. 5 is a cross-sectional view of the IC socket having the IC carrier loaded therein.

By having the spring 6 act on the pivotal portion of the external end of the turnable lever 5 and a lower end of the lock lever 4, a downward force is applied to the lock lever 4 and a downward turning force is applied to the external end of the turnable lever 5. As one example, one end of the spring 6 is connected to the shaft 8 and the other end thereof is connected to the socket base 1, so that a tensile force is applied to the pivotal portion of the external end portion of the turnable lever 5 and the lower end of the lock lever 4 in order to lower the levers 4 and 5. In the alternative, as shown in FIGS. 3 and 5, an arrangement is made such that a downward force is applied to the pivotal portion of the lock lever 4 and the turnable lever 5.

In this way, the spring 6 applies a downward force to that side of the lock lever 4 on which the external end 10 of the turnable lever 5 acts and also simultaneously applies a downward turning force to the external end 10 of the turnable lever 5. As a result, the external end, i.e., that end on which the spring 6 acts, of the turnable lever 5 is turned downwardly, and as a reaction thereof, the internal end 11 of the turnable lever 5 opposite to the above-mentioned end on which the spring 6 acts is turned upwardly. The internal end 11 is resiliently contacted with the cover 2 under the effect of the spring 6, so that the cover 2 is pushed up. As means for causing the internal end 11 of the turnable lever 5 to act on the cover 2, for example, the cover 2 is provided with a pressure receiving and pressing plate 12 disposed along a lower surface of the IC or IC carrier 3 and the internal end 11 of the turnable lever 5 is resiliently contacted with the lower surface of the pressure receiving and pressing plate 12.

When the cover 2 is depressed, the pressure receiving and pressing plate 12 acts as a pressing portion for applying a depression force to the internal end 11 of the turnable lever 5. When the depression force to the cover 2 is removed, the pressure receiving and pressing plate 12 acts as a pressure receiving portion to which an upward force is applied from the turnable lever 5.

Similarly, the internal end 11 of the turnable lever 5 acts as a pressing portion for applying an upward force to the cover 2 and also as a pressure receiving portion to which a downward force is applied from the cover 2.

The cover 2 has hooks 26 formed on opposite side walls thereof and adapted to loosely fit in elongate guide grooves 27 formed in opposite side walls of the socket base 1 and extending in an upward and downward direction. The hooks 26 can move upwardly and downwardly respectively along the guide grooves 27. By means of the hooks 26 and the guide grooves 27, the upward and downward motion of the cover 2 is guided and an amount of upward and downward motion of the cover 2 is limited within the range of the grooves 27.

The cover 2 has a window 14 which is open to outside at an upper location of the IC receiving section 13 which is formed in a central area of the upper surface of the socket base 1. The IC or IC carrier 3 is loaded in the IC receiving section 13 through the window 14, with IC contact elements 16 arranged on a lower surface of the IC 15 placed on contacts 17 retained by the socket base 1. The contacts 17 are arranged along two or four sides of the IC receiving section 13 and capable of contacting the IC contact elements 16 which are arranged along two or four sides of the IC.

When the IC or IC carrier 3 is loaded in the IC receiving section 13 through the window 14 of the cover 2, the lock lever 4 must be in a backwardly shifted position so that the lock lever 4 will not interfere with the IC or IC carrier 3.

When the cover 2 is depressed by means of manual operation or a robot, a downward force is applied to the internal end 11 of the turnable lever 5 by the pressure receiving and pressing plate 12. By this, the internal end 11 of the turnable lever 5 is turned downwardly against the force of the spring 6, and as a reaction thereof, the external end 10 on the other side of the turnable lever 5 is turned upwardly. As a result, an upward force is applied to the lock lever 4 so that the lock lever 4 will be moved upwardly (see FIG. 7).

As a consequence, the locking claws 9 of the lock lever 4 are brought upwardly away from the edge portion of the upper surface of the IC or IC carrier 3. After being brought upwardly away from the IC or IC carrier 3, the lock lever 4 is turned backwardly so that the locking claws 9 are completely disengaged.

When the locking claws 9 are in the disengaging position, the IC or IC carrier 3 is removed from the IC receiving section 13 or a fresh IC or IC carrier 3 is loaded in the IC receiving section 13. Thereafter, when the depression force to the cover 2 is removed, the external end 10 of the turnable lever 5 is turned downwardly about the shaft 7 by the spring 6, and as a reaction thereof, the internal end 11 of the turnable lever 5 is turned upwardly to push the cover 2 upwardly. Simultaneously with this action, the spring 6 applies a downward force to the lower end of the lock lever 4 so that the lock lever 4 is lowered. At the time the lock lever 4 is lowered, the lock lever 4 is turned forwardly about the shaft 8, so that the locking claws 9 are engaged with the edge portion of the upper surface of the IC or IC carrier 3 and at the same time, a downward force is applied to the IC or IC carrier 3 through the locking claws 9 to press the contact elements 16 of the IC 5 against the contacts 17 of the socket base 1, and thereby a contacting pressure can be obtained. The contacts 17 are implanted in the socket base 1. Each contact 17 includes a spring portion which is capable of flexing upwardly and downwardly, and also a contact portion situated at an upper side of the spring portion. A corresponding one of the contact elements 16 of the IC 15 is placed on this contact portion and pressed by the lock lever 4 so the spring portion is flexed downwardly and as a reaction thereof, the above-mentioned contacting pressure is obtained. At the same time, a wiping action occurs at the contacting surface between the contact portion of the contact 17 and the IC contact element 16.

The present invention is suited to be used for the case in which, as illustrated, the contact elements 16 and the contacts 17 are contacted with each other in their pressed condition, on a lower surface of the IC 15. As another example, the invention is likewise applicable to a gull-wing type IC package, a flat type IC package, a J-bent type IC package, etc. in which the contact elements 16 extend sideways from two or four sides of the IC 15.

The socket includes means for moving the lock lever 4 forwardly and backwardly when the lock lever 4 is moved upwardly and downwardly. For moving the lock lever 4 forwardly and backwardly, the cover 2 may act on the lock lever 4. As one specific example, a pressing portion 18 is provided on a lower end of a side wall of the cover 2 along the back of the lock lever 4, and a pressure receiving portion 19 comprising a cantilever projecting backwardly from the area in the vicinity of the pivotal portion is provided opposite the pressing portion 18.

Figure 6:
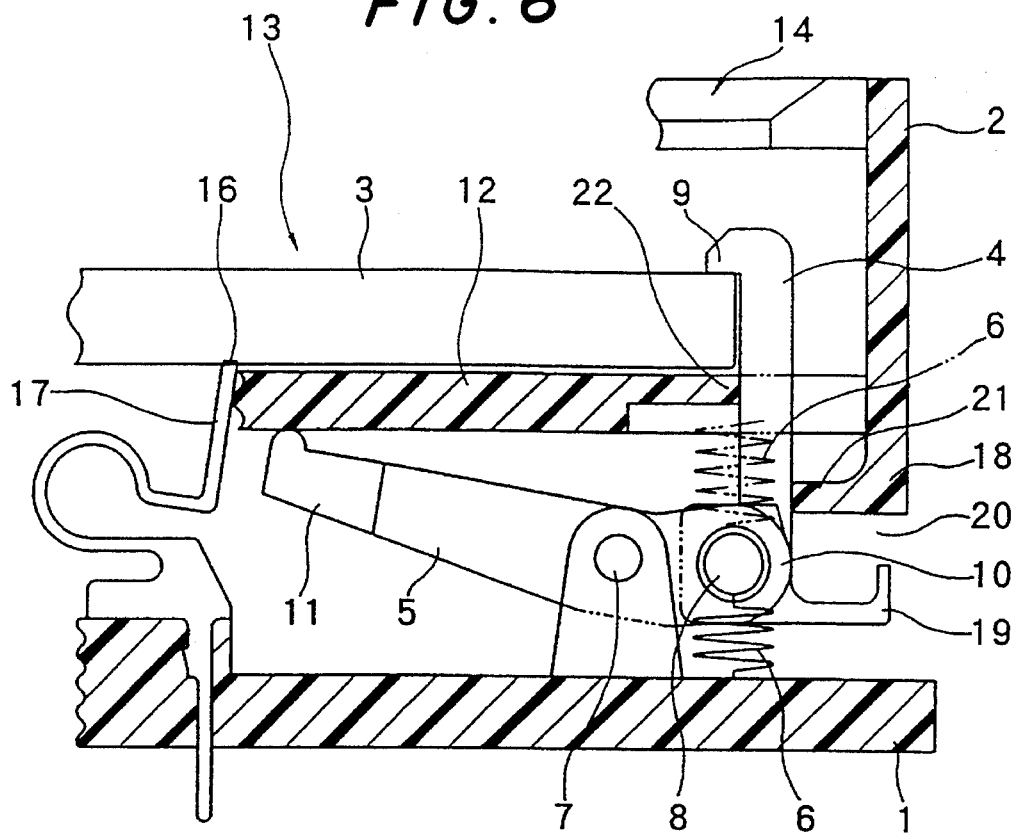
FIG. 6 is a cross-sectional view of an important portion of the IC socket in which a lock lever is in engagement with an IC or IC carrier.

As shown in FIG. 6, when the cover 2 is raised, the pressing portion 18 is spaced upwardly from the pressure receiving portion 19 with a distance 20 therebetween.

Figure 7:
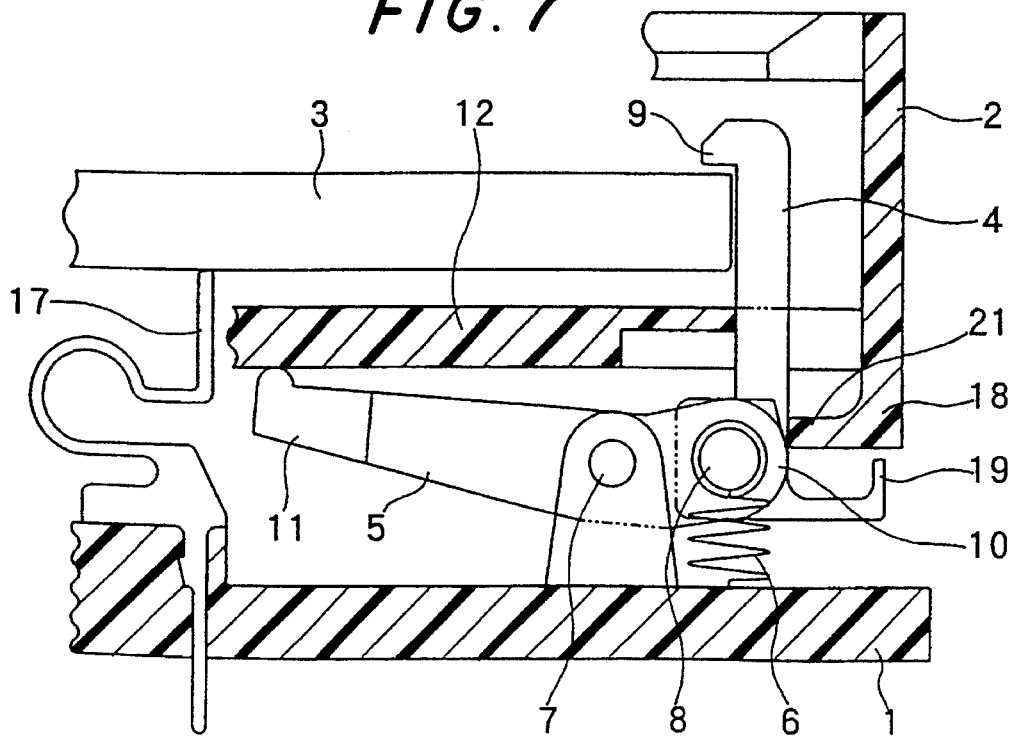
FIG. 7 is a cross-sectional view of an important portion of the IC socket in which the lock lever is spaced further upwardly from an edge portion of an upper surface of the IC or IC carrier.
Figure 8:
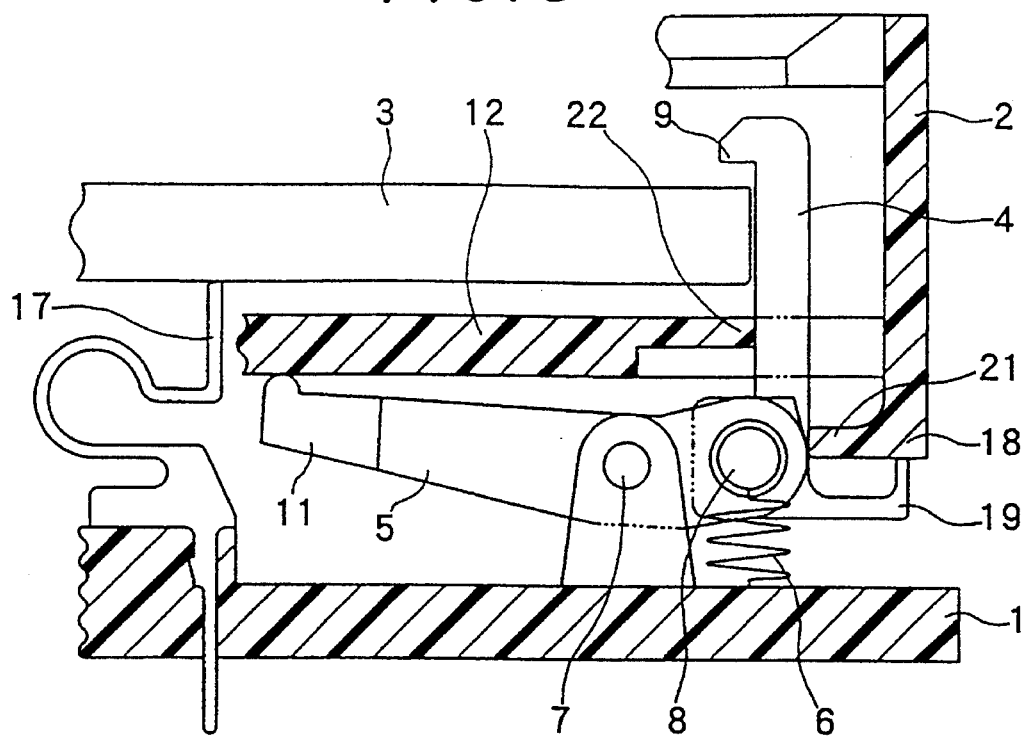
FIG. 8 is a cross-sectional view of an important portion of the IC socket in which the lock lever is more away upwardly from an edge portion of an upper surface of the IC or IC carrier and the cover starts acting on the lock lever.
Figure 9:
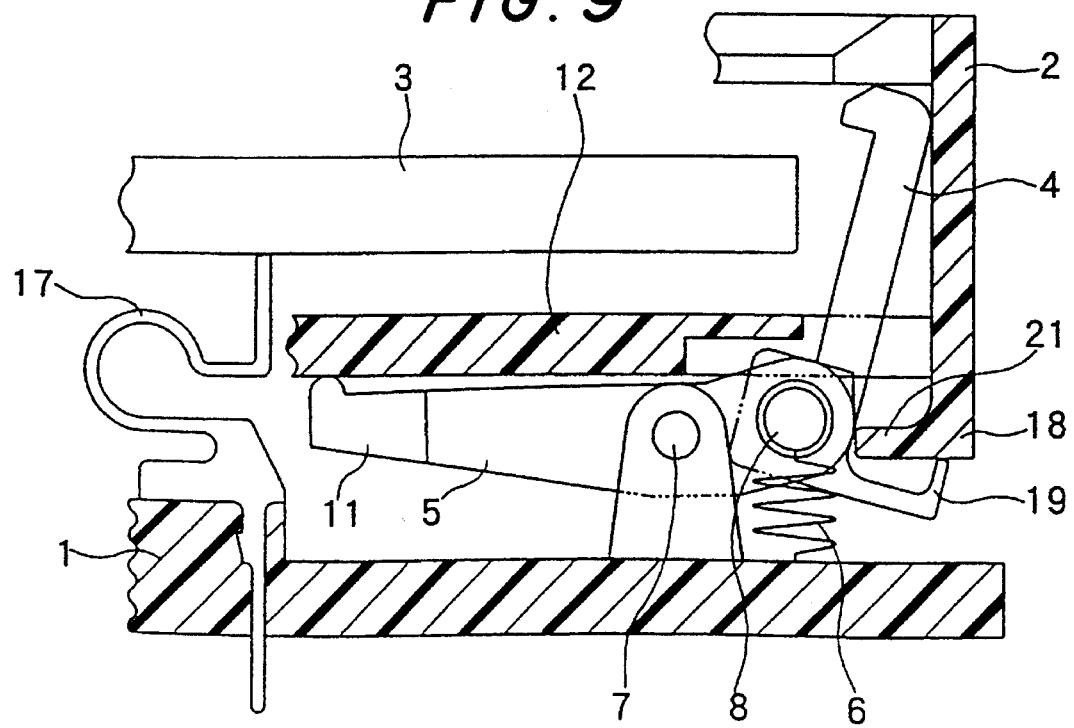
FIG. 9 is a cross-sectional view of an important portion of the IC socket in which the lock lever is spaced further backwardly from the IC or IC carrier.

When the cover 2 is depressed in that condition, as shown in FIGS. 7 to 9 inclusive, the pressing portion 18 depresses the pressure receiving portion 19 and as a result, the lock lever 4 is turned backwardly about the shaft 8. The lock lever 4 is raised by the turnable lever 5 until the pressing portion 18 acts on the pressure receiving portion 19.

In other words, after the turnable lever 5 raises the lock lever 4 a predetermined amount and the locking claws 9 of the lock lever 4 are spaced upwardly from the edge portion of the upper surface of the IC or IC carrier 3 (see FIG. 7), the pressing portion 18 acts on the pressure receiving portion 19 so that the lock lever 4 is shifted backwardly (see FIGS. 8 and 9). For this purpose, the distance 20 of FIG. 6 is provided between the pressing portion 18 and the pressure receiving portion 19.

The cover 2 is provided with a pusher 21 formed on a lower end portion (for example, portion in the vicinity of the pressing portion) of the side wall thereof. This pusher 21 is operated to act on the back of the upstanding lock lever 4. When the depression force to the cover 2 is removed, the cover 2 is pushed upwardly by the turnable lever 5 as previously mentioned. During the course of the upward movement of the cover 2 and the downward movement of the lock lever 4, the pusher 21 presses the back of the lock lever 4 in the backward position forwardly, so that the lock lever 4 is brought to a location above the edge portion of the upper surface of the IC or IC carrier 3 (see FIGS. 8 and 9).

At the same time, the external end 10 of the turnable lever 5 is turned downwardly by the spring 6 during the time the internal end 11 of the turnable lever 5 pushes the pressure receiving and pressing plate 12 of the cover 2. In association with the downward movement of the external end 10 of the turnable lever 5, the lock lever 4 is lowered. As the lock lever 4 is lowered, the locking claws 9 are brought into engagement with the edge portion of the upper surface of the IC or IC carrier 3. In that engaging condition, the lock lever 4 is further lowered a very small amount so that a depression force is applied to the IC or IC carrier 3. As a result, the IC contact element 16 placed on the contact 7 is pressed against the contact 17 so that a sufficient contacting pressure can be obtained.

During the first half of the upward movement, the cover 2 causes both the forward shifting of the lock lever 4 and the downward movement of the lock lever 4 (see FIGS. 8 and 9). During the latter half of the upward movement, the pressing portion 18 is moved from the pressure receiving portion 19, thereby causing only the downward movement of the lock lever 4 (see FIGS. 6 and 7). As a result, the distance 20 is formed again between the pressing portion 18 and the pressure receiving portion 19.

As means for preventing the lock lever 4 from falling down forwardly, there is a provision of a front abutment member 22 on the side of the cover 2. This front abutment member 22 operates to restrict the front of the upstanding lock lever 4. The lock lever 4 is guided upwardly and downwardly between the front abutment member 22 and the pusher 21.

The front abutment member 22 is integral with the pressure receiving and pressing plate 12, for example. Specifically, the pressure receiving and pressing portion 12 is provided on one end portion thereof with a portion opposing the front of the lock lever 4 and this facing portion is serves as the front abutment member 22. This front abutment member 22 is integrally formed on the socket base 1.

By properly arranging the spring 6 such that a resilient force is applied to the area in the vicinity of its connecting portion with the end of the turnable lever 5, there can be obtained generally the same effect as the spring acting directly on the lower end of the lock lever 4 so as to apply a depression force to the lock lever. At the same time, there can be obtained a force for pushing the cover 2 upwardly by turning the one end 10 of the turnable lever 5 downwardly so as to turn the other end 11 upwardly.

Figure 4:
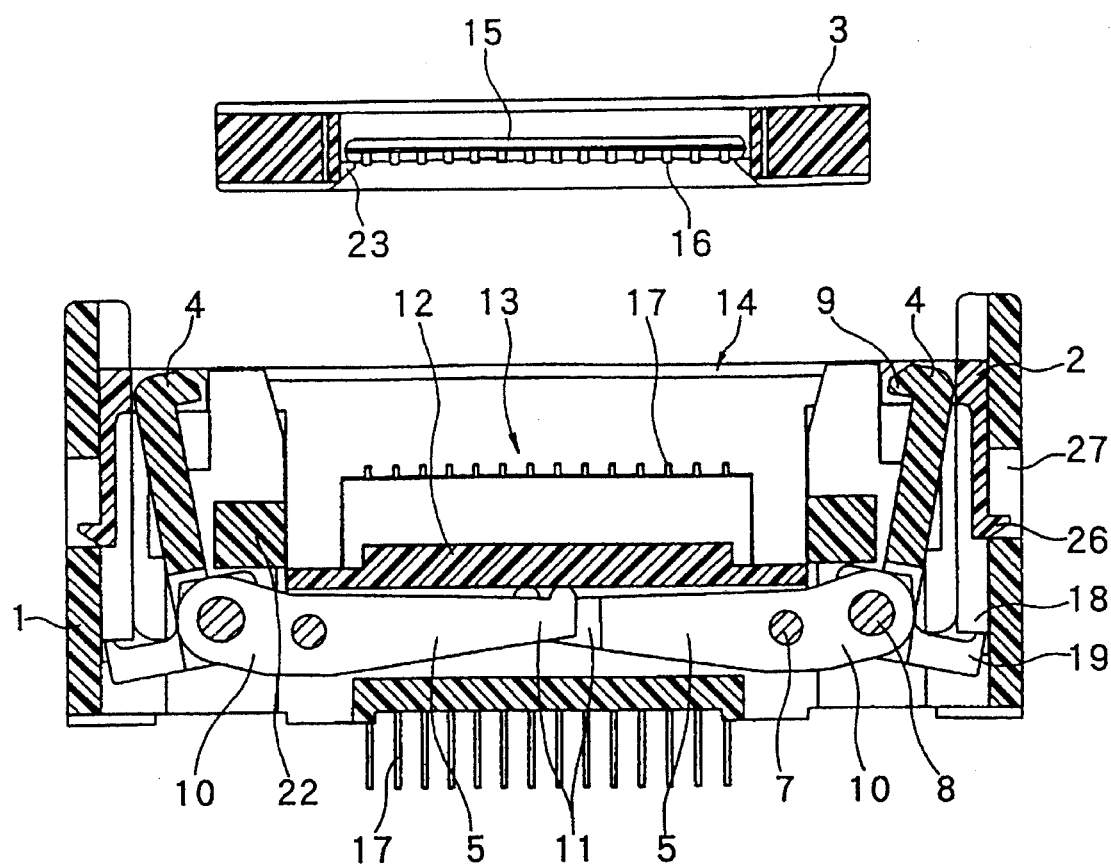
FIG. 4 is a cross-sectional view of the IC socket and an IC carrier which is not yet loaded in the IC socket.

As shown in FIGS. 3, 4 and 5, as well as elsewhere, the IC retainer comprises a pair of turnable levers 4 extending from opposite ends of the socket base 1 toward the center of the socket base 1 along the lower surface of the IC or IC carrier 3, and a pair of lock levers 4 which are axially turnably supported by the external ends 10, i.e., the ends of the turnable levers 4 which are situated on the opposite ends of the socket base 1.

Accordingly, the lock levers 4 are arranged in opposing relation on the opposite ends of the socket base 1, and the internal end 11 of the turnable lever 5 extends to the central portion of the socket base 1 (i.e, the lever 5 extends almost to the central portion of the IC or IC carrier 3) so that the end 11 acts on the central portion of the IC or IC carrier 3.

As shown in FIGS. 3 to 5 inclusive, as well as elsewhere, the internal end 11 of one of the turnable levers 5 and the internal end 11 of the other turnable lever 5 are intermeshed with each other. The length from the shaft 7 to the internal end 11 of each turnable lever 5 is dimensioned as long as possible so that the lever action can be effectively exhibited and so that the internal ends 11 may act uniformly on the central portion of the pressure receiving and pressing portion 12 of the cover 2.

Figure 10:
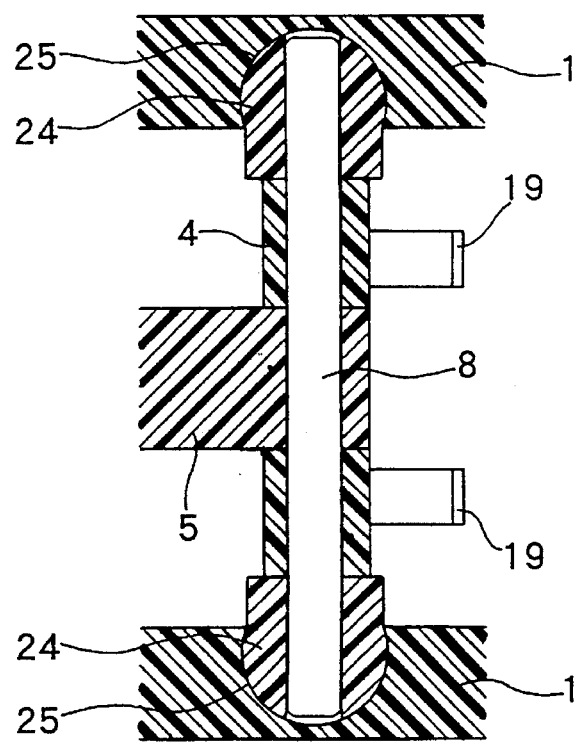
FIG. 10 is a top cross-sectional view showing a guide mechanism for upward and downward motion of the lock lever.

As shown in FIG. 3 or FIG. 10, or elsewhere, a pair of blocks 24 are disposed on opposite lower ends of each lock lever 4. By slip fitting the blocks 24 in guide grooves 25 formed in the socket base 1, the lock levers 4 are guided upwardly and downwardly. The springs 6 act on the upper surface of the guide blocks 24 to apply a downward force thereto, and the side surfaces of the guide blocks 24 are supported by the shafts 8, respectively.

FIG. 4 shows the carrier 3 with the IC 15 carried therein. The IC 15 is retained in the carrier 3 through latches 23 provided on the carrier 3. The IC 15 alone or the IC 15 retained in the IC carrier 3 is loaded in the receiving section 13 of the socket base 1. Therefore, the lock levers 4 are engaged with and disengaged from the edge portion of the upper surface of the IC 15 or the edge portion of the upper surface of the IC carrier 3.

Figure 11:
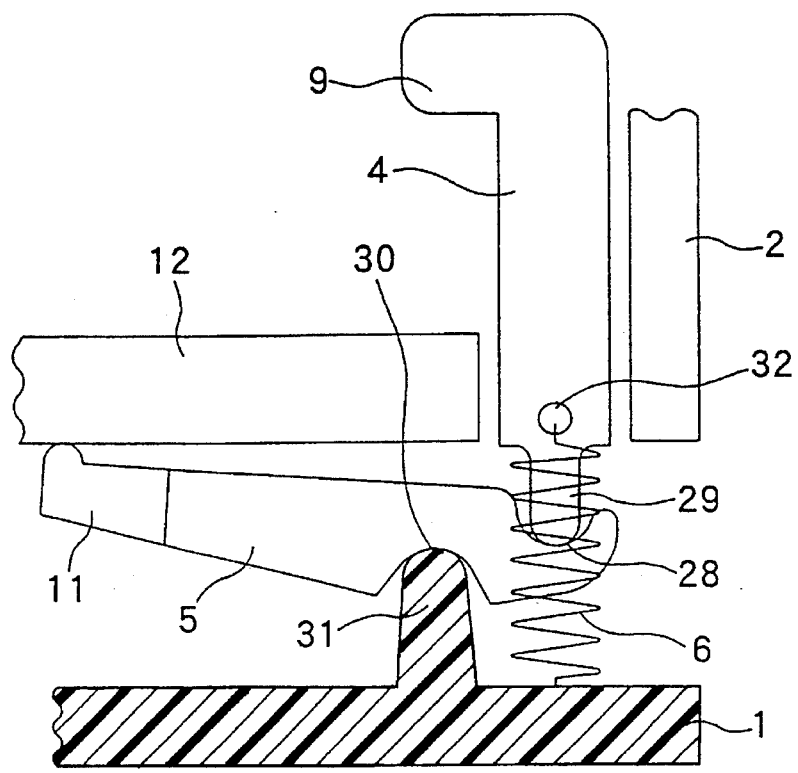
FIG. 11 is a side view showing another example of one end of the turnable lever acting on the lock lever.

FIGS. 1 to 9 inclusive show one embodiment in which the lower end of each lock lever 4 and the external end 10 of each turnable lever 5 are supported by the pin 8. However, the example shown in FIG. 11 does not employ such a pivotal support structure as mentioned. As shown in FIG. 11, the external end 10 of the turnable lever 5 and the lower end of the lock lever 4 are merely contacted with each other, and the spring 6 applies a downward tensile force to the lower end of the lock lever 4 so that the contacting state between the levers 5 and 4 is maintained by this downward tensile force. Owing to this arrangement, the associated movements of the lock lever 4 and the turnable lever 5 can be obtained.

In the above example, a recess 28 is formed in one of the lock lever 4 and the turnable lever 5, and a projection 29 is formed on the remaining lever 4 or 5, so that the contacting position is maintained by slip fitting this projection 29 in the recess 28.

Similarly, the turnable lever 5 may be supported but not by means of the shaft 7 as mentioned with respect to the preceding embodiment. In that case, as shown in FIG. 11, a recess 30 is formed in one of the turnable lever 5 and the socket base 1, and a projection 31 is formed on the remaining one 5 or 1, so that the supporting position is maintained by slip fitting this projection 31 in the recess 30 and the turnable lever 5 is capable of turning upwardly and downwardly. It should be noted that one or both of the shafts 7 and 8 may be omitted and the slip-fit engagement between the recess and the projection may be employed for it. In FIG. 11, reference numeral 32 denotes a shaft for connecting the pair of opposing lock levers 4.

According to the present invention so far described, since the spring applies a downward force to the external end of the lock lever on which the turnable lever acts, there can be obtained an appropriate upward and downward motion by properly applying the spring force as well as the amount of motion of the spring to the lock lever. Therefore, the lock lever can be positively engaged with and disengaged from the edge portion of the IC or IC carrier 3 and an appropriate contacting pressure can be obtained.

Further, since the internal end of the turnable lever on which the spring acts is resiliently contacted with the cover so as to push the cover upwardly, the turnable lever can perform a proper movement in association with the upward and downward movement of the cover simply by way of the resilient contact between the turnable lever and the cover. With this feature, it is no longer necessary, unlike the prior art, to link the turnable lever and the cover by means of a shaft and an elongate slot and therefore, the problem associated with the linkage can be totally obviated.

While some preferred embodiments of an IC retainer in an IC socket according to the present invention have thus far been described with reference to the drawings, it should be borne in mind that such embodiments are merely illustrative of the gist of the invention and are accordingly subject to modification and change.

What is claimed is:

1. An IC retainer in an IC socket comprising a lock lever for engaging and disengaging from an IC or an IC carrier in accordance with upward and downward motion of a cover, a turnable lever for transforming the upward and downward motion of said cover to upward and downward motion of said lock lever, means for shifting said lock lever to a backward disengaging position when said lock lever is moved upwardly and to a forward engaging position when said lock lever is lowered, and spring means for applying a downward turning force to an external end portion of said turnable lever while applying a lowering force to a side of said lock lever on which the external end portion of said turnable lever acts, an internal end portion of said turnable lever opposite to that end portion on which said spring means acts being turned upwardly by the downward turning force applied to said external end portion of said turnable lever, so that an upwardly directing force is applied to the cover.

2. The IC retainer as claimed in claim 1, further comprising a pusher mounted on said cover and adapted to push the back of said lock lever forwardly when said lock lever is lowered.

3. The IC retainer as claimed in claim 1, further comprising a front abutment member for restricting the front of said lock lever.

* * * * *